United States Patent
Kaminski et al.

(10) Patent No.: US 6,320,300 B1
(45) Date of Patent: Nov. 20, 2001

(54) PIEZOELECTRIC ARRAY DEVICES

(75) Inventors: Walter J. Kaminski, Long Valley; Arild Kolsrud, Parsippany, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/146,482

(22) Filed: Sep. 3, 1998

(51) Int. Cl.$^7$ .................................................. H01L 41/04
(52) U.S. Cl. .................................. 310/328; 310/317
(58) Field of Search .................. 310/328, 317, 310/312

(56) References Cited

U.S. PATENT DOCUMENTS

| | | | |
|---|---|---|---|
| 2,101,272 | * 12/1937 | Scott | 310/328 |
| 2,347,098 | * 4/1944 | Green | 310/328 |
| 2,551,848 | * 5/1951 | Parker | 310/328 |
| 2,636,135 | * 4/1953 | Peek, Jr. | 310/328 |
| 2,834,943 | * 5/1958 | Grisdale et al. | 310/328 |
| 2,945,192 | * 7/1960 | Szymanski | 310/328 |
| 3,570,476 | * 3/1971 | Gregg | 601/2 |
| 4,096,756 | * 6/1978 | Alphonse | 73/609 |
| 5,163,436 | * 11/1992 | Saitoh et al. | 128/662.03 |
| 5,217,214 | * 6/1993 | Takei | 269/73 |
| 5,410,205 | * 4/1995 | Gururaja | 310/328 |
| 5,825,117 | * 10/1998 | Ossmann et al. | 310/317 |
| 6,119,804 | * 9/2000 | Owen | 181/113 |

* cited by examiner

Primary Examiner—Nestor Ramirez
Assistant Examiner—Peter Medley
(74) Attorney, Agent, or Firm—Gibbons, Del Deo, Dolan, Griffinger & Vecchione

(57) ABSTRACT

Piezoelectric crystals are arranged to function as variable resonators. In one embodiment, three crystals are arranged as an array, with a center crystal between two outer crystals. An electrical excitation of the outer crystals causes a mechanical displacement in the crystals along a common axis. This displacement squeezes the center crystal, resulting in a shift of the crystal's resonant frequency. By this arrangement, signals input to the outer crystals vary the resonant properties of the inner crystal.

21 Claims, 3 Drawing Sheets

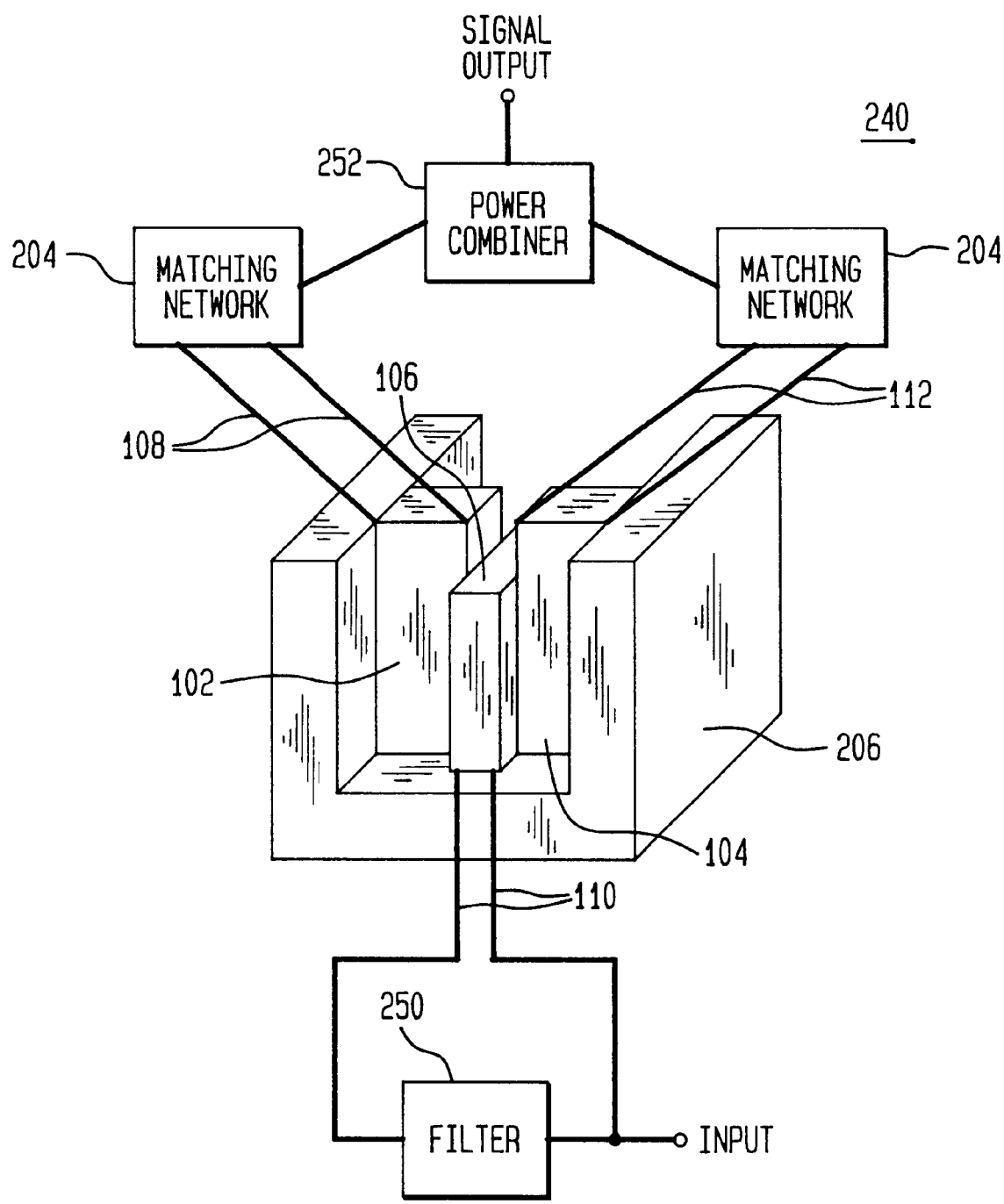

PIEZOELECTRIC ARRAY DEVICES

FIELD OF THE INVENTION

The invention relates generally to piezoelectric devices and more particularly to piezoelectric resonators.

BACKGROUND OF THE INVENTION

Radio communication system components, such as transmitters and receivers, include a variety of filters, modulators, mixers, and oscillators for processing both digital and analog signals. Many of these devices have resonators made from discrete circuit components, such as capacitors, inductors, and resistors. The limitations of discrete circuit components in resonators are well known. They exhibit non-ideal, unstable or parasitic behavior. They are also heavy and bulky, impeding light-weight and cost effective designs in radio circuits.

The piezoelectric properties of crystalline structures are also well known. Applying an electric field to a piezoelectric crystal will distort the crystal lattice. Similarly, mechanically deforming a piezoelectric crystal produces an electric field. Piezoelectric crystals also resonate at various frequencies, and they are often used as resonators in radio circuits.

Despite the valued properties of piezoelectric crystals, their use in radio circuits has been substantially limited to oscillators and filters, where they are well suited for introducing frequency stability. Nevertheless, it is a disadvantage that the resonant frequencies of a piezoelectric crystal are fixed at the time of manufacture and that its properties may degrade over time. While the use of crystal resonators has provided performance benefits, it has not reduced the use. of discrete devices in radio circuits, and the potential benefits of piezoelectric properties remains largely untapped.

SUMMARY OF THE INVENTION

In this invention, piezoelectric crystals are arranged to function as variable resonators. In one embodiment, three piezoelectric crystals are arranged as an array, with a center crystal interposed between two outer crystals. The piezoelectric crystals are arranged such that an electrical excitation of the outer crystals causes a mechanical displacement in the outer crystals along an axis common to all three crystals. This displacement squeezes the center crystal, resulting in a shift of the center crystal's resonant frequency. By this arrangement, electric signals input to the outer crystals vary the resonant frequency of the center crystal.

A variable piezoelectric crystal resonator is well suited to radio circuits. In one embodiment, the piezoelectric device of this invention is a resonator in a typical oscillator circuit which then operates as a frequency modulator. A time varying input signal is coupled through a power divider to each of the two outer piezoelectric crystals. The input signal excites the outer crystals causing a mechanical displacement in the outer crystals according to the input signal. In turn, the outer crystals, which are held in mechanically responsive orientation with the center piezoelectric crystal, cause a mechanical displacement in the center crystal, varying its resonant frequency in accordance with the input signal. Because the oscillator's resonant frequency varies as a function of the input signal, application of a time varying input signal produces a frequency modulated signal at the oscillator output.

In another embodiment, the array forms a resonator for a tunable pre-select filter. Instead of a time varying input signal, a DC bias is placed across the outer piezoelectric crystals. The crystals change their dimension in accordance with the bias, thereby applying pressure to the center piezoelectric crystal. The pressure distorts the center crystal causing a shift in its resonant frequency. The center crystal is coupled as a resonator in a filter circuit, as is known in the art. Varying the bias voltage tunes the filter.

The arranged structure is not limited to three piezoelectric crystals. The frequency of the center piezoelectric crystal can be controlled by using multiple outer piezoelectric crystal devices. Each of the outer devices can be excited from DC to any frequency within the physical constraints of the crystals. A multiple crystal arrangement permits using some of the crystals to correct for small instabilities in the center frequency of the center crystal while using others for modulation.

BRIEF DESCRIPTION OF THE DRAWINGS

A more complete understanding of the present invention may be obtained from consideration of the following description in conjunction with the drawings in which:

FIG. 2B shows an exemplary device in accordance with this invention;

DETAILED DESCRIPTION

Figure 1:
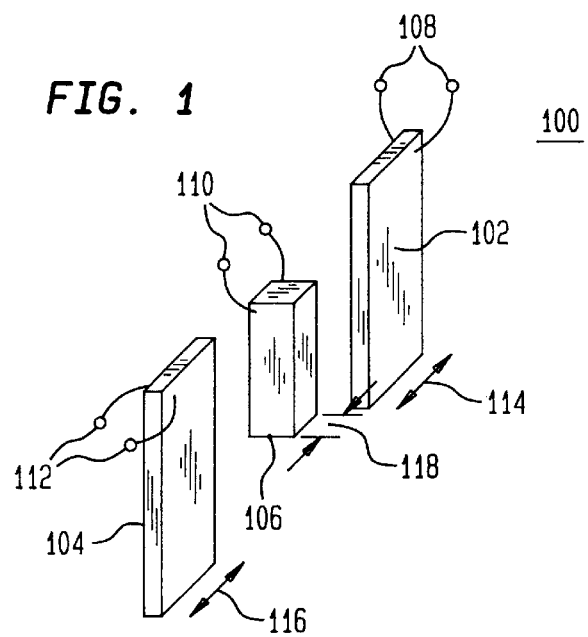
FIG. 1 shows an exemplary arrangement of crystals according to this invention.

This invention uses piezoelectric crystals as variable resonators. For a better understanding of the invention, the initial section explains some of the properties of crystals, particularly piezoelectric properties. The next section discusses an arrangement of piezoelectric crystals according to this invention. Thereafter, this description discusses a frequency modulator, a frequency demodulator and a narrow band pre-select filter, having variable piezoelectric resonators. While these exemplary embodiments comprise three piezoelectric crystals, it will be seen at the conclusion of the discussion that any number of crystals may be used.

Piezoelectric Crystal Properties

A piezoelectric crystal is any material which becomes electrically polarized when mechanically strained and where mechanical deformation results from the application of an electric field. Crystals such as quartz possess a distortable atomic structure with piezoelectric properties. An electric field applied to a piezoelectric crystal distorts the crystal lattice just as if a mechanical force had been applied. Likewise, a deformation caused by mechanical force will result in an electrical excitation.

These properties, known as piezoelectric effect, are due to the electric charges captive in the piezoelectric crystal's lattice structure. The relation between mechanical deformation and electric field in a piezoelectric crystal is expressed as $dD_i = K_{ij} * dE_j$, where $K_{ij}$ is the permittivity tensor and $dD_i$ and $dE_j$ represent small changes in physical displacement and in electric field, respectively.

Piezoelectric crystals also possess resonant properties. They resonate at a family of different frequencies, where the lowest resonant frequency is the fundamental. The other resonant frequencies are called overtones. Typically, crystals may resonate in the 1 to 30 megahertz range, but fundamental resonance frequencies at over 100 megahertz are known.

Depending upon the crystal cut and mode, either the thickness or the length of the piezoelectric crystal will control the resonant frequency. So, for instance, in the thickness expansion (TE) mode or the thickness shear (TS) mode, the thickness controls the resonant frequencies of the crystal, whereas in the face shear (FS) mode, transverse length expansion ($Le_t$) mode, and parallel length expansion ($Le_p$) mode the length of the piezoelectric crystal controls the frequency.

The crystal cut and mode will also determine the typical range of operation. In the TE and TS modes, piezoelectric crystals operate primarily at frequencies greater than 1 megahertz. In other modes, such as FS, $LE_t$, $LE_p$, and the planar expansion ($Pe_t$) mode, crystals operate at frequencies of less than 1 megahertz.

Excitation of various piezoelectric crystals may be provided by a transverse effect, where the electric field is at right angles (or transverse) with the displacement, or by a longitudinal effect, where the electric field is parallel with the displacement. The concepts of transverse effect, longitudinal effect and piezoelectric modes are further discussed in Cady, W. G., *Piezoelectricity, An Introduction to the Theory and Applications of Electromechanical Phenomena and Crystals*, Dover Publications, Inc., N.Y., 1964 and in Fink, D. G. & McKenzie, A. A., *Electronics Engineers Handbook*, McGraw-Hill Book Company, N.Y., 1975. Further mechanical to electrical (piezoelectric) properties of crystals are discussed in Bell, D. A., *Electronic Devices & Circuits*, Reston Publishing Company, Inc., Reston, Va. and in Nye, J. F., *Physical Properties of Crystals*, Oxford at the Clarendon Press, 1957.

A Piezoelectric Crystal Array According to this Invention: FIG. 1

FIG. 1 shows an arrangement of piezoelectric crystals 100 according to this invention. The crystals 102, 104, 106 are shown with electrical coupling (input/output) means, in this case electrodes 108, 112, 110. A first outer crystal 102 and a second outer crystal 104 are cut to operate in the $LE_t$ mode. In this mode, the length of the piezoelectric crystal controls the crystal's resonant frequency. An electric signal placed upon the electrodes 108 of the first outer crystal 102 and upon the electrodes 112 of the second outer crystal 104 causes a mechanical displacement along their length as indicated by the arrows 114, 116 at the bottom of the crystals 102, 104. The outer crystals 102, 104 are held in mechanically responsive orientation with the center crystal 106; in other words, a mechanical displacement of the outer. crystals 102, 104 causes a mechanical displacement in the center crystal 106. The contact between the crystals should be such as to reduce capacitive loads.

The center piezoelectric crystal 106 is chosen to operate in the TE mode. In this mode, a mechanical displacement in thickness, shown by the arrow 118 at the bottom of the center crystal 106, results in an electric signal at the electrodes 110 of the crystal 106 as well as a change in the crystal's 106 resonant frequency. In this arrangement, the center crystal's resonant frequency will vary according to the signals appearing at the electrodes 108, 112 of the outer piezoelectric crystals 102, 104.

Although this embodiment illustrates using the TE and $LE_t$ modes, a person of ordinary skill in the art will appreciate that different embodiments may be employed including using other modes, such as the TS mode for the center piezoelectric crystal and the FS, $LE_t$, or $LE_p$ modes for the outer piezoelectric crystals. A person of ordinary skill in the art will also appreciate that exciting the center crystal 106 with an electric signal causes mechanical displacement and an electric excitation in the outer crystals 102, 104.

Figure 2A:
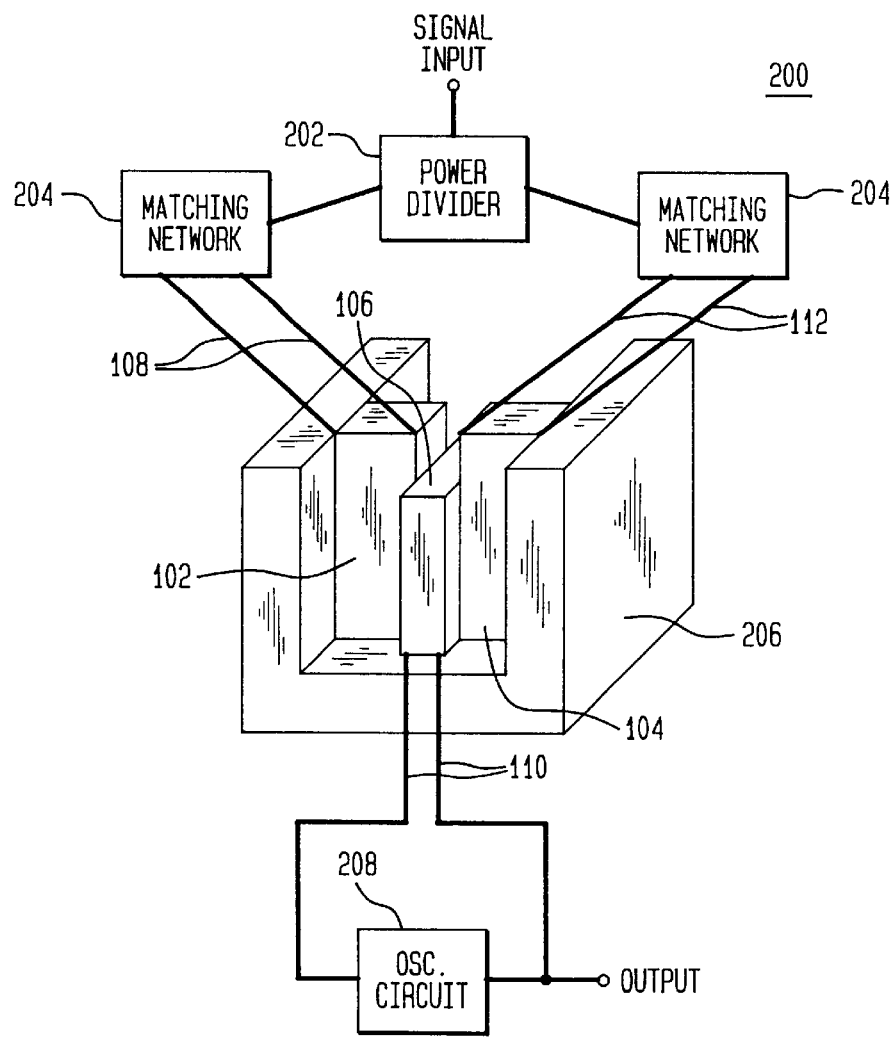
FIG. 2A shows an exemplary device in accordance with this invention.
Figure 3:
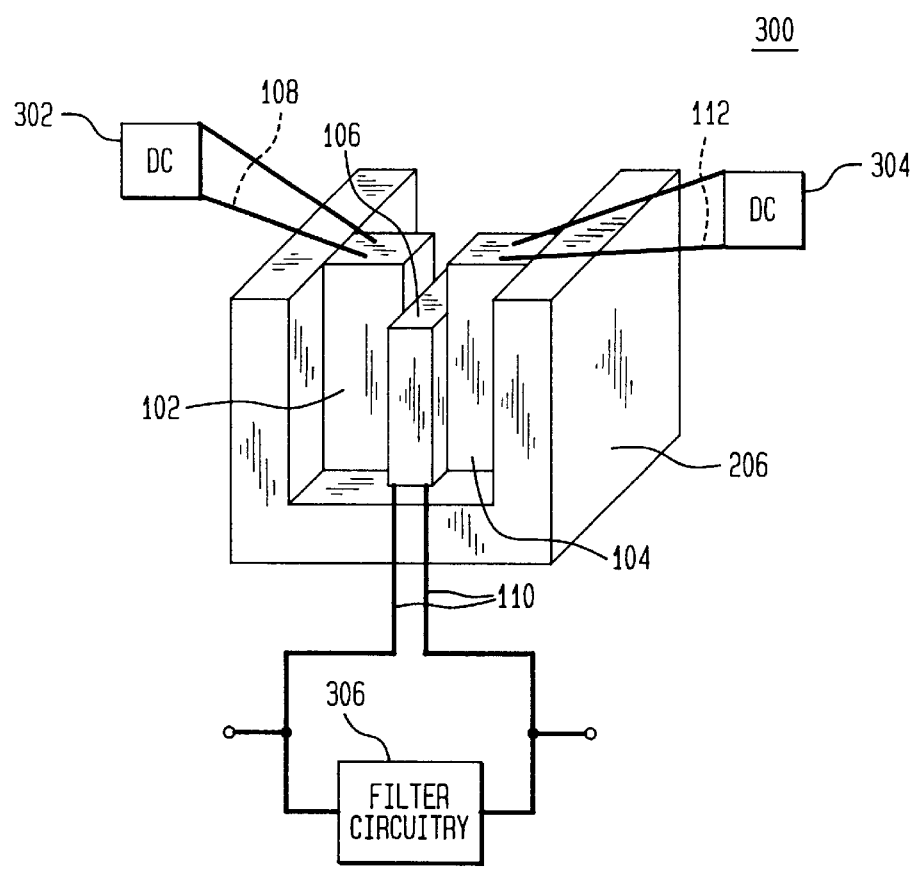
FIG. 3 shows another exemplary device according to the present invention.

Exemplary Circuits: FIGS. 2A, 2B and 3

In FIG. 2A, this piezoelectric crystal arrangement is illustrated in a frequency modulator 200. The outer piezoelectric crystals 102, 104 and center piezoelectric crystal 106 are held in the desired arrangement by a rigid crystal holder 206. The rigid crystal holder may be constructed from any material with high insulation properties, such as ceramic. The center crystal 106 is electrically coupled through its electrodes 110 in an oscillator circuit 208. The particulars of the oscillator circuit 208 are unimportant, except that the center crystal acts as a resonator for the oscillator. For particular oscillator circuits, refer to *The ARRL Handbook*, The American Radio Relay League, Newington, CT 75th ed. Chpt. 14.

The outer crystals 102, 104 are electrically connected to matching networks 204 through their electrodes 108, 112. The design and use of matching networks with crystal oscillators is known in the art and discussions may be found in Fink, D. G. & McKenzie, A. A., *Electronics Engineers Handbook*, McGraw-Hill Book Company, N.Y., 1975 and in Frerking, N. E., *Crystal Oscillator Design in Temperature Compensation*, VanNostrand Reinhold, N.Y., 1978. The matching networks 204 are electrically coupled to a power divider 202 which is responsive to a time varying input signal. The matching network 204 and power divider 202 comprise a means for applying an input signal to the outer crystals 102, 104.

Operation of the frequency modulator embodiment is as follows. The time varying input signal is applied to the power divider 202 which splits the signal. The resulting signals are applied to the outer piezoelectric crystals 102, 104 through the matching networks 204. The signals cause a mechanical displacement in the outer crystals 102, 104 in accordance with the applied signals. The outer crystals 102, 104 are held in mechanically responsive orientation with the center piezoelectric crystal 106 by means of the rigid crystal holder 206. The mechanical displacement of the outer crystals 102, 104 causes a mechanical displacement of the center crystal 106. This displacement causes a shift in the crystal's 106 resonant frequency according to the input signal. The center crystal 106 is coupled as a resonator for the oscillator circuit 208. As the oscillator runs, its resonant frequency varies according to the input signal, and the oscillator outputs a frequency modulated signal.

The circuit of FIG. 2A can also be configured to operate as a demodulator 240, as shown in FIG. 2B. The outer piezoelectric crystals 102, 104 and center piezoelectric crystal 106 are again held in mechanically responsive orientation. The center crystal 106 is electrically coupled through its electrodes 110 in a filter circuit 250. The particulars of the filter circuit 250 are again unimportant, except that the center crystal 106 acts as a resonator for the filter 250. The matching networks 204 are electrically coupled to a power combiner 252 which is responsive to signals from the matching networks 204. In this configuration, the matching networks 204 and power combiner 252 comprise a means for outputting a signal.

A carrier signal frequency modulated by an information signal is applied to the filter circuit 250. The modulated signal causes a mechanical displacement in the center piezoelectric crystal 106 in accordance with the input signal. Displacement of the center crystal 106 causes a mechanical displacement in the outer piezoelectric crystals 102, 104. This displacement causes an electric excitation resonant at the frequency of the information signal appearing on the electrodes 108, 112. These signals are combined in power combiner 252 which outputs the demodulated signal.

FIG. 3 shows a tunable filter according to this invention. A variable resonator for the tunable filter 300 comprises the outer piezoelectric crystals 102, 104 and the piezoelectric center crystal 106 held in mechanically responsive orientation by rigid crystal holder 206. The outer crystals 102, 104 are connected to a DC signal 302, 304 through their electrodes 108, 112. In a preferred embodiment, the DC signals 302, 304 are adjustable. Center crystal 106 is electrically coupled to act as a resonator for a filter circuit 306 through its electrodes 110. The particular characteristics of the filter circuit are unimportant.

The application of a DC bias signal on the outer piezoelectric crystals 102, 104 changes their dimension, thereby applying pressure to the center piezoelectric crystal 106. This pressure changes the width of the crystal 106 resulting in a shift of its resonant frequency. Since the center crystal 106 is a resonator for the filter 306, the filter response is changed about a center frequency in accordance with the DC bias signals 302, 304. An adjustable DC bias permits adjusting the center frequency of the output spectrum. Although many utilities would be apparent to one with ordinary skill in the art, this embodiment is preferably used to tune narrow band pre-select filters.

Figure 4:
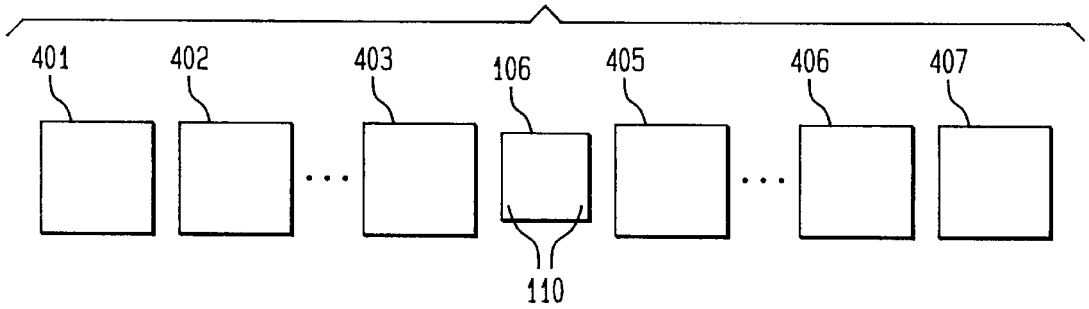
FIG. 4 shows an exemplary arrangement of crystals according to the present invention.

Another Exemplary Array: FIG. 4

A plurality of crystals can be arranged for the purpose of controlling the frequency of the center piezoelectric crystal 106, as shown in FIG. 4. In this arrangement, the center crystal 106 is between a plurality of piezoelectric crystals on each side. The center crystal 106 is chosen such that its resonant frequency changes in response to a change in width. A plurality of outer piezoelectric crystals 401–403, 405–407 are arranged such that an electric signal applied to their electrical coupling means (electrodes) causes change in their lengths which share a common axis with the width of the center crystal 106. All the crystals 401–407 are in rigid contact with each other through the use of a rigid crystal holder (not shown). The outer crystals 401–403, 405–407 are responsive to electric excitations from DC to at least 1 megahertz. By this multiple crystal arrangement, small instabilities in the frequency of the center crystal 106 can be adjusted by applying a DC bias signal to one or more of the outer crystals. The remaining outer crystals are responsive to time varying input signals, such as in the modulator of FIG. 2A.

A person with ordinary skill in the art will appreciate that the just described embodiments are merely exemplary and that other embodiments, arrangements and modes may be used in accordance with this invention. For instance, as little as two piezoelectric crystals in mechanically responsive orientation may be used. The descriptions, including the nodes and arrangements, should not be construed as limiting the invention.

What is claimed is:

1. A piezoelectric device having a variable resonant frequency, comprising:

a first piezoelectric crystal having electrical input means;

a second piezoelectric crystal having electrical input means;

a third piezoelectric crystal interposed in mechanically responsive orientation between said first piezoelectric crystal and said second piezoelectric crystal, said orientation being one in which said third piezoelectric crystal is in contact with, but not attached to, said first and said second piezoelectric crystals; and means for maintaining said first, second and third crystals in contact with one another, wherein an electrical signal input to either of said first piezoelectric crystal or said second piezoelectric crystal causes a mechanical displacement of said third piezoelectric crystal, said mechanical displacement causing a change in a resonant frequency of said third piezoelectric crystal.

2. The device of claim 1 wherein said first piezoelectric crystal operates in a mode chosen from the group comprising face shear, transverse length expansion, parallel length expansion, planar expansion, thickness expansion or thickness shear.

3. The device of claim 1 wherein said second piezoelectric crystal operates in a mode chosen from the group comprising face shear, transverse length expansion, parallel length expansion, planar expansion, thickness expansion or thickness shear.

4. The device of claim 1 wherein said third piezoelectric crystal operates in a mode chosen from the group comprising face shear, transverse length expansion, parallel length expansion, planar expansion, thickness expansion or thickness shear.

5. The device of claim 1 wherein said maintaining means includes a crystal holder.

6. The device of claim 5 wherein said crystal holder is ceramic.

7. A frequency modulator having an oscillator circuit, the oscillator circuit having a piezoelectric resonator with a variable resonant frequency, the piezoelectric resonator comprising:

a first piezoelectric crystal having electrical input means;

a second piezoelectric crystal having electrical input means;

a third piezoelectric crystal interposed in mechanically responsive orientation between said first piezoelectric crystal and said second piezoelectric crystal, said orientation being one in which said third piezoelectric crystal is in contact with, but not attached to, said first and said second piezoelectric crystals;

means for maintaining said first, second and third crystals in contact with one another; and means for applying an input signal to either of said first piezoelectric crystal or said second piezoelectric crystal, wherein said input signal causes a mechanical displacement of said third piezoelectric crystal, said mechanical displacement varying the resonant frequency of said third piezoelectric crystal.

8. The device of claim 7 wherein said means for applying an input signal comprises:

a power divider, responsive to said input signal, for substantially dividing said input signal;

a first matching network coupled between said first piezoelectric crystal and said power divider; and, a second matching network coupled between said second piezoelectric crystal and said power divider.

9. The device of claim 7 wherein said input signal is a time varying signal.

10. A filter having a piezoelectric resonator with a variable resonant frequency, the piezoelectric resonator comprising:

a first piezoelectric crystal having electrical input means;

a second piezoelectric crystal having electrical input means;

a third piezoelectric crystal interposed in mechanically responsive orientation between said first piezoelectric crystal and said second piezoelectric crystal, said orientation being one in which said third piezoelectric crystal is in contact with, but not attached to, said first and said second piezoelectric crystals;

means for maintaining said first, second and third crystals in contact with one another; and means for applying an input signal to either of said first piezoelectric crystal or said second piezoelectric crystal, wherein said input signal causes a mechanical displacement of said third piezoelectric crystal, said mechanical displacement varying the resonant frequency of said third piezoelectric crystal.

11. The filter of claim 10 wherein said input signal is a DC bias signal.

12. A demodulator having a filter circuit, the filter circuit having a piezoelectric resonator with a variable resonant frequency, the piezoelectric resonator comprising:

a first piezoelectric crystal having electrical output means;

a second piezoelectric crystal having electrical output means;

a third piezoelectric crystal interposed in mechanically responsive orientation between said first piezoelectric crystal and said second piezoelectric crystal, said orientation being one in which said third piezoelectric crystal is in contact with, but not attached to, said first and said second piezoelectric crystals; and means for maintaining said first and second crystals in contact with one another, wherein said first and said second piezoelectric crystals output a signal in accordance with a mechanical displacement in said third piezoelectric crystal.

13. The device of claim 12 further comprising:

a power combiner;

a first matching network coupled between said first piezoelectric crystal and said power combiner; and, a second matching network coupled between said second piezoelectric crystal and said power combiner, wherein said power combiner is responsive to signals caused by a mechanical displacement of said third piezoelectric crystal.

14. A piezoelectric device having a variable resonant frequency, comprising:

a plurality of piezoelectric crystals having electrical coupling means, each of said crystals in mechanically responsive orientation to at least one other of said crystals, said orientation being one in which each of said plurality of crystals is in contact with, but not attached to each immediately adjacent crystal, and means for maintaining said plurality of crystals in contact with one another, wherein the resonant frequency of at least one of said crystals is varied according to an input signal applied to at least one other of said crystals, the input signal causing a mechanical displacement of said at least one other of said crystals.

15. A frequency modulator having an oscillator circuit, the oscillator circuit having a piezoelectric resonator with a variable resonant frequency, the piezoelectric resonator comprising:

a plurality of piezoelectric crystals having electrical coupling means, each of said crystals in mechanically responsive orientation to at least one other of said crystals, said orientation being one in which each of said plurality of crystals is in contact with, but not attached to, each immediately adjacent crystal, and means for maintaining said plurality of crystals in contact with one another, wherein the resonant frequency of at least one of said crystals is varied according to an input signal applied to at least one other of said crystals, the input signal causing a mechanical displacement of said at least one other of said crystals.

16. A filter having a piezoelectric resonator with a variable resonant frequency, the piezoelectric resonator comprising:

a plurality of piezoelectric crystals having electrical coupling means, each of said crystals in mechanically responsive orientation to at least one other of said crystals, said orientation being one in which each of said plurality of crystals is in contact with, but not attached to, each immediately adjacent crystal, and means for maintaining said plurality of crystals in contact with, one another, wherein the resonant frequency of at least one of said crystals is varied according to an input signal applied to at least one other of said crystals, the input signal causing a mechanical displacement of said at least one other of said crystals.

17. A piezoelectric device having a variable resonant frequency, comprising:

a first piezoelectric crystal having electrical input means;

a second piezoelectric crystal, mounted in mechanically responsive orientation with said first piezoelectric crystal, said orientation being one in which first and second crystals are in contact with, but not attached to, one another; and means for maintaining said first and second crystals in contact with one another, wherein a signal input to said first piezoelectric crystal causes a change in the resonant frequency of said second piezoelectric crystal, the input signal causing a mechanical displacement of said second piezoelectric crystal.

18. A circuit having a piezoelectric resonator with a variable resonant frequency, the piezoelectric resonator comprising:

a first piezoelectric crystal having electrical input means; and a second piezoelectric crystal, mounted in mechanically responsive orientation with said first piezoelectric crystal, said orientation being one in which first and second crystals are in contact with, but not attached to, one another; and means for maintaining said first and second crystals in contact with one another, wherein a signal input to said first piezoelectric crystal causes a change in said resonant frequency of said second piezoelectric crystal, the input signal causing a mechanical displacement of said second piezoelectric crystal.

19. Demodulator having a filter circuit, the filter circuit having a piezoelectric resonator with a variable resonant frequency, the piezoelectric resonator comprising:

a first piezoelectric crystal having electrical input means; and, a second piezoelectric crystal, mounted in mechanically responsive orientation with said first piezoelectric crystal, said orientation being one in which first and second crystals are in contact with, but not attached to, one another; and means for maintaining said first and second crystals in contact with one another, wherein said second piezoelectric crystal outputs a signal in accordance with a mechanical displacement in said first piezoelectric crystal.

20. A piezoelectric device having a variable resonant frequency, comprising:

a first piezoelectric crystal having input electrodes;

a second piezoelectric crystal having input electrodes;

a third piezoelectric crystal interposed in mechanically responsive orientation between said first piezoelectric crystal and said second piezoelectric crystal, said orientation being one in which said third piezoelectric crystal is in contact with, but not attached to, said first and said second piezoelectric crystals; and means for maintaining said first and second crystals in contact with one another, wherein an electrical signal input to either of said first piezoelectric crystal or said second piezoelectric crystal causes a change in a resonant frequency of said third piezoelectric crystal via a mechanical displacement in at least one of said first or second crystals along an axis common to all three crystals.

21. The piezoelectric device of claim 20, wherein said maintaining means includes a crystal holder.

* * * * *